United States Patent
Hsieh et al.

(10) Patent No.: US 7,071,112 B2
(45) Date of Patent: Jul. 4, 2006

(54) BARC SHAPING FOR IMPROVED FABRICATION OF DUAL DAMASCENE INTEGRATED CIRCUIT FEATURES

(75) Inventors: Chang-Lin Hsieh, San Jose, CA (US); QiQun Zhang, Santa Clara, CA (US); Jie Yuan, San Jose, CA (US); Terry Leung, San Jose, CA (US); Silvia Halim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/278,233

(22) Filed: Oct. 21, 2002

(65) Prior Publication Data

US 2004/0077175 A1 Apr. 22, 2004

(51) Int. Cl.
*H01L 21/311* (2006.01)
(52) U.S. Cl. .................. 438/700; 438/723; 438/725
(58) Field of Classification Search ............... 438/700, 438/706, 710, 714, 723, 724, 725
See application file for complete search history.

(56) References Cited

U.S. PATENT DOCUMENTS

| | | | |
|---|---|---|---|
| 6,001,688 A | 12/1999 | Rizzuto | 438/264 |
| 6,037,264 A | 3/2000 | Hwang | 438/714 |
| 6,087,265 A | 7/2000 | Hwang | 438/706 |
| 6,136,680 A | 10/2000 | Lai et al. | 438/597 |
| 6,243,939 B1 | 6/2001 | Chen et al. | 29/603.14 |
| 6,245,662 B1 | 6/2001 | Naik et al. | 438/622 |
| 6,277,762 B1 | 8/2001 | Hwang | 438/714 |
| 6,281,583 B1 | 8/2001 | Dirahoui et al. | 257/752 |
| 6,284,657 B1 * | 9/2001 | Chooi et al. | 438/687 |
| 6,309,910 B1 | 10/2001 | Haba et al. | 438/113 |
| 6,309,955 B1 | 10/2001 | Subramanian et al. | 438/618 |
| 6,323,132 B1 | 11/2001 | Hwang et al. | 438/706 |
| 6,331,479 B1 | 12/2001 | Li et al. | 438/618 |
| 6,340,435 B1 | 1/2002 | Bjorkman et al. | 216/72 |
| 6,348,406 B1 | 2/2002 | Subramanian et al. | 438/636 |
| 6,358,838 B1 | 3/2002 | Furusawa et al. | 438/622 |
| 6,365,228 B1 | 4/2002 | Tsai et al. | 427/240 |

(Continued)

OTHER PUBLICATIONS

AOO. "Dual-Damascene Challenge Dielectric Etch", Semiconductor International, Peter Singer, Editor-in-Chief, Aug. 1, 1999, web site pp. 1-4 of http://www.e-insite.net.

*Primary Examiner*—Kin-Chan Chen
(74) *Attorney, Agent, or Firm*—Michaelson & Associates

(57) ABSTRACT

Method, materials and structures are described for the fabrication of dual damascene features in integrated circuits. In via-first dual damascene fabrication, a bottom-antireflective-coating ("BARC") is commonly deposited into the via and field regions surrounding the via, 107. Subsequent trench etch with conventional etching chemistries typically results in isolated regions of BARC, 107a, surrounded by "fencing" material, 108, at the bottom of the via. Such fencing hinders conformal coating with barrier/adhesion layers and can reduce device yield. The present invention relates to the formation of a BARC plug, 107c, partially filling the via and having a convex upper surface, 400, prior to etching the trench. Such a BARC structure is shown to lead to etching without the formation of fencing and a clean dual damascene structure for subsequent coating. A directional, anisotropic etching of BARC, and more particularly, an ammonia plasma etch, is one convenient method of removing BARC and forming the desired convex upper surface.

26 Claims, 8 Drawing Sheets

U.S. PATENT DOCUMENTS

| | | | |
|---|---|---|---|
| 6,376,365 B1 | 4/2002 | Tsuji | 438/637 |
| 6,376,389 B1 | 4/2002 | Subramanian et al. | 438/740 |
| 6,383,893 B1 | 5/2002 | Begle et al. | 438/460 |
| 6,383,907 B1 | 5/2002 | Hasegawa et al. | 438/597 |
| 6,387,798 B1 | 5/2002 | Loke et al. | 438/623 |
| 6,391,757 B1 | 5/2002 | Huang et al. | 438/597 |
| 6,406,962 B1 | 6/2002 | Agnello et al. | 438/268 |
| 6,569,777 B1 * | 5/2003 | Hsu et al. | 438/725 |
| 6,635,185 B1 * | 10/2003 | Demmin et al. | 216/64 |
| 6,680,252 B1 * | 1/2004 | Chen et al. | 438/691 |
| 2001/0002731 A1 | 6/2001 | Ueda | 257/750 |
| 2001/0029105 A1 | 10/2001 | Seta et al. | 257/750 |
| 2001/0044205 A1 | 11/2001 | Gilbert et al. | 438/653 |
| 2001/0049195 A1 | 12/2001 | Chooi et al. | 438/687 |
| 2001/0054766 A1 | 12/2001 | Dirahoui et al. | 257/752 |
| 2001/0055878 A1 | 12/2001 | Chooi et al. | 438/687 |
| 2002/0001951 A1 | 1/2002 | Chooi et al. | 438/687 |
| 2002/0001952 A1 | 1/2002 | Chooi et al. | 438/687 |
| 2002/0042193 A1 | 4/2002 | Noguchi et al. | 438/618 |
| 2002/0048929 A1 | 4/2002 | Naik et al. | 438/622 |
| 2002/0052125 A1 | 5/2002 | Shaffer, II et al. | 438/780 |
| 2002/0055244 A1 | 5/2002 | Burbach et al. | 438/586 |
| 2002/0060518 A1 | 5/2002 | Duineveld et al. | 313/506 |
| 2002/0072223 A1 | 6/2002 | Gilbert et al. | 438/629 |
| 2002/0074309 A1 | 6/2002 | Bjorkman et al. | 216/13 |
| 2002/0076935 A1 | 6/2002 | Maex et al. | 438/706 |
| 2003/0119307 A1 * | 6/2003 | Bekiaris et al. | 438/638 |
| 2004/0041272 A1 * | 3/2004 | Signorini | 257/774 |

* cited by examiner

BARC SHAPING FOR IMPROVED FABRICATION OF DUAL DAMASCENE INTEGRATED CIRCUIT FEATURES

BACKGROUND OF THE INVENTION

1. Field of Invention

The invention relates to the manufacture of integrated circuits and, more particularly, to processes and materials for the fabrication of dual damascene integrated circuit features.

2. Description of the Prior Art

The near-universal trend in the manufacture of integrated circuits (ICs) is towards producing ICs having smaller device dimensions and increased circuit densities. Increasing circuit density results in current-carrying elements lying in close proximity, which tends to increase electronic crosstalk between nearby circuit elements, among other deleterious effects on circuit performance. Decreasing component size includes decreasing the cross-sections of metal interconnection elements ("interconnects"), thereby increasing resistance heating and otherwise hindering circuit performance. Efforts to ameliorate the deleterious effects of increased component densities and decreased interconnect cross-sections include the use of insulating materials with lower dielectric constants than typical oxide insulators ("low k materials"), and the use of conducting materials with higher conductivity than typical aluminum (Al) conductors. Copper is emerging as the leading material for use as the on-chip conductor in typical present-generation ICs.

Copper (Cu) as a high-conductivity conductor in ICs can improve the electronic performance of the circuits but also has disadvantages in comparison with Al. For example, Cu readily diffuses through silicon dioxide, $SiO_2$, the typical inter metal insulator used in ICs. If Cu diffuses into the silicon semiconductor substrate, the electronic properties of the semiconductor can be damaged resulting in degradation of circuit performance or failure of the IC. Also, Cu does not adhere very well to $SiO_2$, complicating the use of Cu for IC interconnects in the presence of oxide insulators. For these and other reasons, the deposition of Cu is typically preceded by the deposition of one or more barrier/adhesion layers for the dual purpose of preventing Cu diffusion and enhancing adhesion. Tantalum/Tantalum Nitride (Ta/TaN) is a typical material used for barrier/adhesion layers in contact with Cu conductors.

In addition to the need for barrier/adhesion layers, Cu presents challenges to precise patterning and etching. For example, Cu does not readily form volatile chlorides or fluorides, rendering typical plasma etching based upon chlorine and/or fluorine chemistries impracticably slow. Thus, subtractive patterning of Cu, in which a Cu layer is selectively etched away below a patterned layer of photoresist, has been largely replaced by "damascene" or "dual damascene" patterning. The resulting IC structures or features are referred to as damascene or dual damascene structures or features.

Damascene patterning typically includes the photo lithographic creation of a pattern in one or more layers of insulator followed by a blanket deposition of the Cu or other interconnect material (preceded by the deposit of barrier/adhesion layer(s) if necessary). The deposited metal typically fills the patterned features in the insulator as well as coats the field regions between features. Metal coating on the field region can be removed by chemical-mechanical-planarization ("CMP") or other techniques, exposing the metal-filled features in the insulator for further coating or other processing. Thus, a pattern of interconnects is created in the insulator without the need for etching a pattern directly into Cu or other metal.

Dual damascene denotes the fabrication of multi-layer features in the insulator before metal is deposited. Thus, a combination of trenches and holes ("visa") can be fabricated in one or more insulating layers by the use of multiple patterning and etching steps preceding the deposit of metal. Planarization and removal of metal from the field region is then performed substantially as in the damascene fabrication of features.

Problems can occur in the patterning and the fabrication of features in ICs as a result of reflection of the exposing radiation from the surface (or surfaces) lying below the layer of photoresist. For example, interferences of incident and reflected radiation occurring within the layer of photoresist lead to non-uniform photoresist exposure and imprecise patterning. In addition, exposing radiation can reflect from surface topography or regions of non-uniform reflectivity resulting in exposure of photoresist in regions lying beneath the photo mask and for which exposure is not desired. In both cases, variations in the feature critical dimensions ("CDs") can occur, adding to the challenges of precise and reproducible fabrication of IC features.

A common practice to eliminate or reduce fabrication problems resulting from radiation reflection is the use of anti-reflective coatings. In particular, Bottom-Anti reflective-Coatings ("BARCBS") are commonly applied beneath the photoresist layer, lying on the surface to be patterned. BARC layers may be designed to absorb radiation that penetrates the layer of photoresist and, by this mechanism, reduce or eliminate the deleterious effects of reflections from the underlying surface. In addition, BARC layers may be designed through choice of BARC material and thickness such that, at the wavelength of the exposing radiation, destructive interference occurs between incident and reflected radiation. Both absorptive and destructive interference effects may be used in the same BARC layer.

However, BARC materials are typically organic materials that commonly etch at different rates from the surrounding insulator (oxide) material. With oxide etching typically performed by means of fluorocarbon chemistries, BARCBS tend to etch at slower rates than the surrounding oxide. This difference in etching often results in the presence of protrusions ("fences" or "fencing") surrounding regions of unetched BARC material. Fences are undesirable for several reasons, including the fact that they are difficult to coat uniformly with material to form a uniform, conform al coating of barrier/adhesion layer. That is, good step-coating in the presence of fencing is hard to achieve with typical physical vapor deposition (PVD) due in large part to shadowing effects of the fencing. Gaps in the coating often result. Incomplete coating with barrier/adhesion layer, followed by Cu deposition, can result in diffusion of the Cu into the silicon regions of the IC, improper electronic performance and possible rejection of the IC.

Thus, a need exists in the art for etching IC features in the presence of BARC layers and the elimination of fencing that typically results therefrom.

SUMMARY OF THE INVENTION

Accordingly and advantageously, the invention provides for the fabrication of dual damascene structures in integrated circuits in such manner and using such materials so as to avoid fencing. Thus, good coverage within the dual damascene features by barrier/adhesion layers is obtained with conventional coating techniques, such as PVD, thereby enhancing device yield.

Fencing is a common problem in via-first dual damascene fabrication processes that include the use of a BARC layer in connection with the patterning that follows via formation. Rather than employ a separate processing step for fence removal, the present invention causes the BARC plug in the via to have a substantially convex shape on its upper surface. The present invention demonstrates that such convex BARC, unlike planar, concave or "dishing" structures commonly present in BARC, avoids fencing when further etching to form the trench is performed. The invention further demonstrates that treatment with ammonia plasma is an advantageous technique for shaping the BARC into the desired convex geometry on its upper surface. The invention further demonstrates that presence of a convex BARC plug in the via permits etching of the trench structure with conventional plasma chemistries, such as fluorocarbon, without the occurrence of fencing.

These and other advantages are achieved in accordance with the present invention as described in detail below.

BRIEF DESCRIPTION OF THE DRAWINGS

The techniques of the present invention can readily be understood by considering the following detailed description in conjunction with the accompanying drawings, in which.

To facilitate understanding, identical reference numerals have been used, where possible, to designate identical elements that are common to the figures. The drawings are not to scale and the relative dimensions of various elements in the drawings are depicted schematically and not to scale.

DETAILED DESCRIPTION

After considering the following description, those skilled in the art will clearly realize that the teachings of the invention can be readily utilized in the fabrication of integrated circuits and particularly in the reduction or avoidance of fencing that occurs in dual damascene fabrication of integrated circuit features.

Figure 1A:
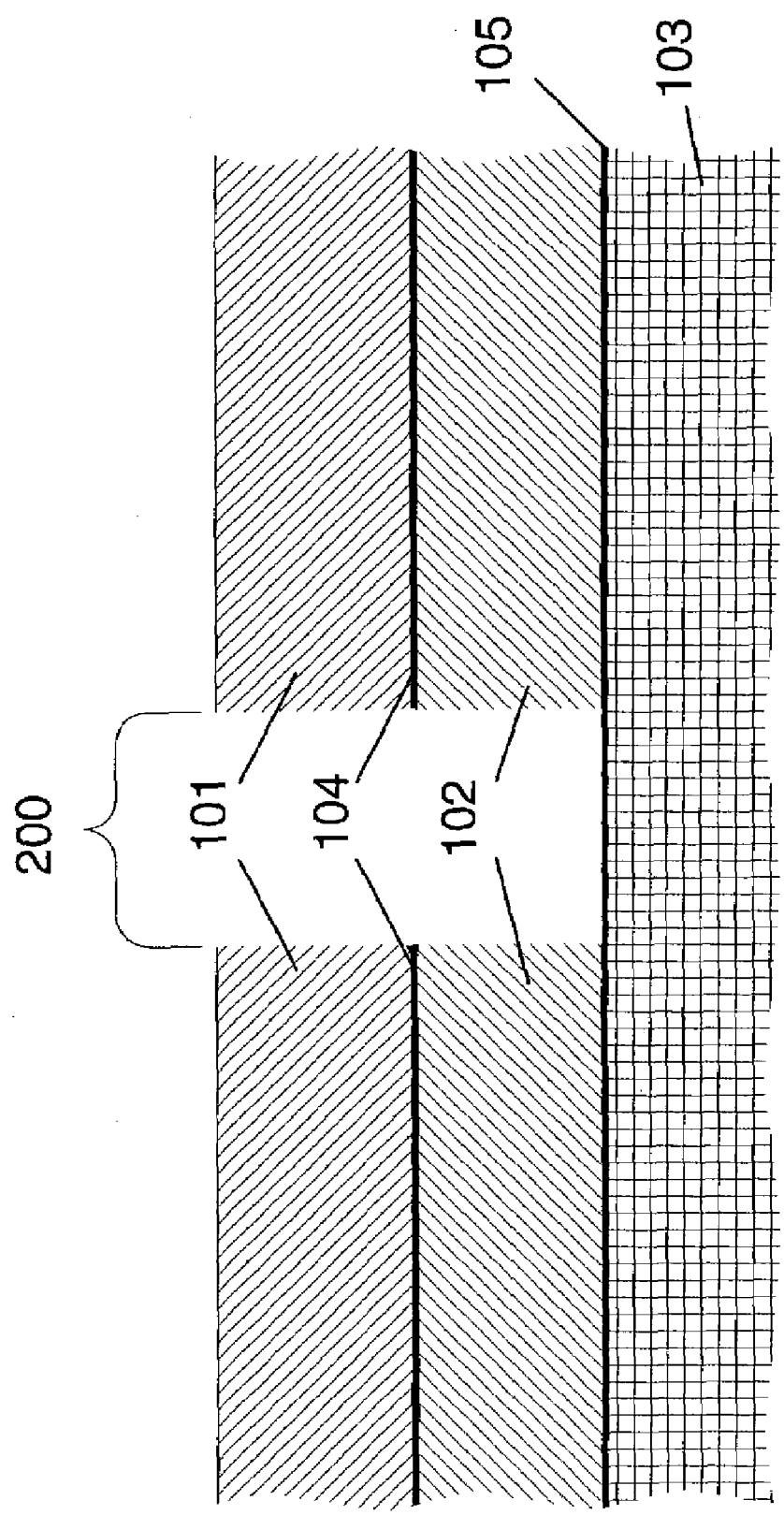
FIG. 1a. Via formation FIG. 1b. Photoresist patterning for trench fabrication.

One common type of dual damascene fabrication technique involves the fabrication of a via or hole through multiple layers of insulator followed by trench fabrication on top of, and aligned with, the via. FIG. 1a depicts in schematic cross-section (not to scale) a typical structure resulting from such "via-first" fabrication in which via, 200, is patterned and etched to the layer of the substrate, 103.

Insulator layers, 101 and 102, lie on a substrate, 103. The insulators most commonly comprise oxides (e.g., silicon oxide) but other, low k, materials are finding increasing use in place of, or in conjunction with, oxides. To be concrete in our description, we consider in detail the case in which two insulator layers are present, optionally separated by a stop layer (or middle stop layer), 104. Layers 101 and 102 can be the same or different materials and need not have uniform composition throughout each layer. Two layers are depicted herein to indicate the two levels of etching performed in dual damascene patterning, not to imply any other distinguishing characteristic possessed by either or both of the layers.

A major function of middle stop layer, 104, is to provide a processing marker to indicate that the end point for etching layer 101 has been reached. However, the techniques described herein are also applicable to dual damascene fabrication of features in a single insulator layer ("non-middle stop layer") in which the completion of etching layer 101 is typically determined by the time of etch, interferometry, or a technique other than an end point indicated by a middle stop layer. Use of the present invention in dual damascene fabrication with and without middle stop layers would be apparent to those having ordinary skills in the art and all such embodiments are included within its scope.

Substrate 103 can be the semiconductor substrate providing the electronic functionality of the IC or can be one or more layers of insulators and/or conductors resulting from prior steps in the IC fabrication process. All such substrates are commonly referred to herein as "substrate" for economy of language. Furthermore, the boundary between 102 and 103 need not be flat but typically contains structure resulting from prior patterning, deposition and/or planarization steps. Such structure (if any) is omitted from the figures for simplicity of depiction.

Optionally, a stop layer, 105, lies between the lower insulator layer 102 and substrate 103 to indicate the end point of insulator etch for layer 102. When using dual damascene fabrication techniques, lower stop layer 105 also can be used to provide a measure of protection to substrate 103 during insulator etch, particularly in the absence of a BARC layer.

Figure 1B:
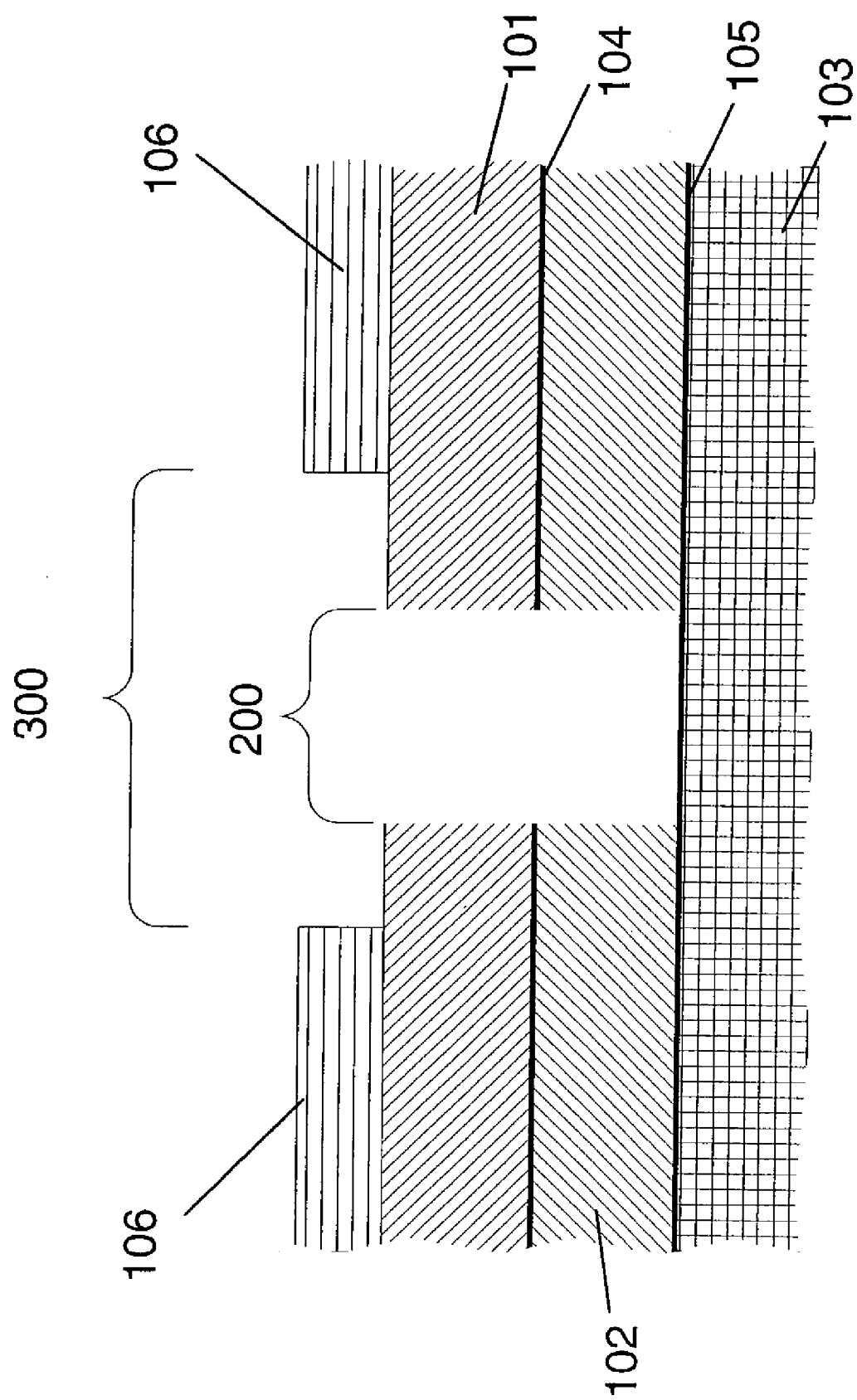
FIG. 1 depicts in schematic cross-sectional view typical structures occurring in the via-first dual damascene fabrication of integrated circuit features without the use of BARC, including.
FIG. 1c. Trench etching with faceting.
Figure 1C:
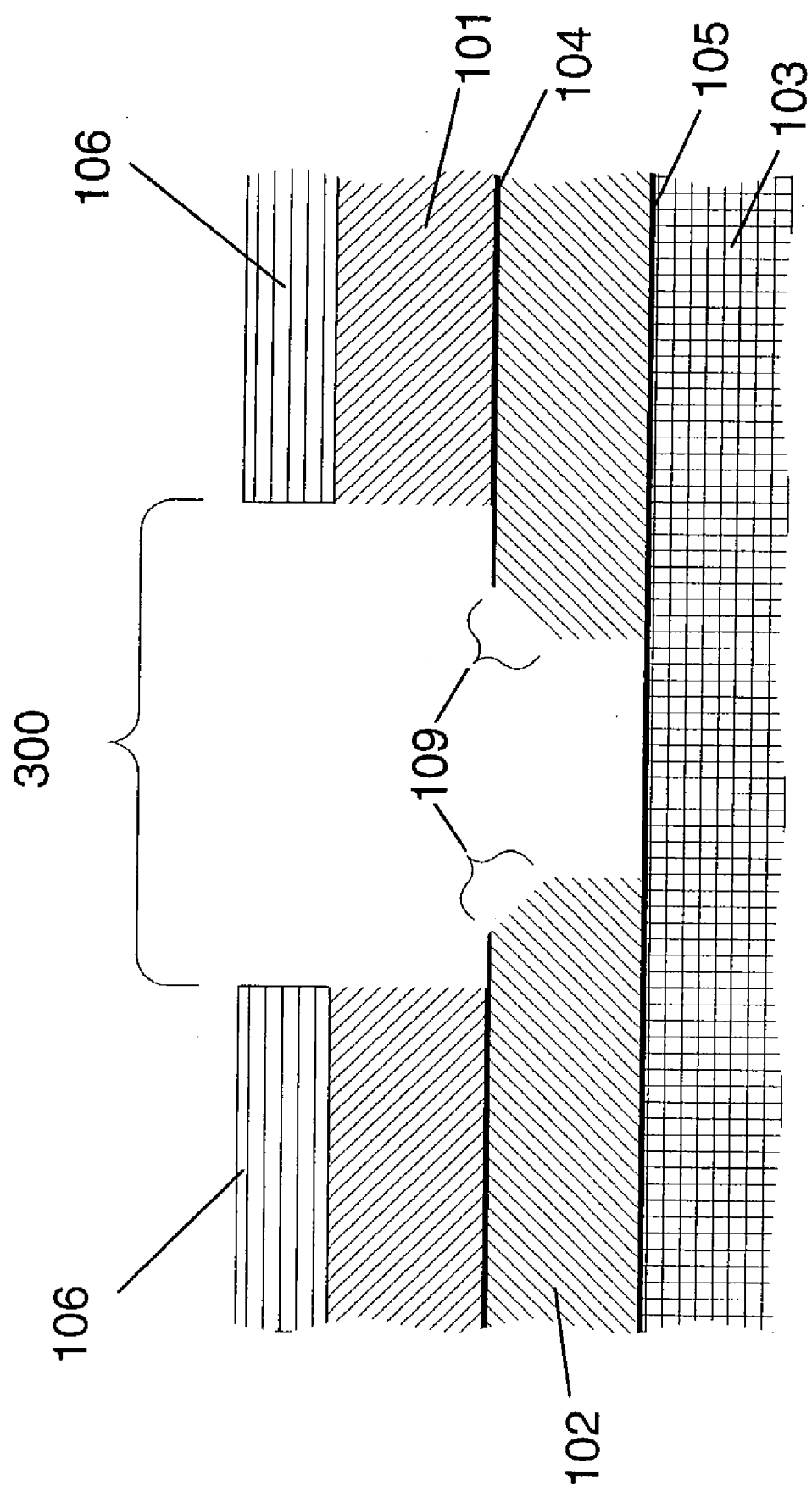

Via-first dual damascene fabrication of IC structures includes the fabrication of a trench in layer 101 surrounding via 200. FIG. 1b depicts a layer of photoresist, 106, patterned for the formation of a trench, 300. Etching a trench above an unfilled via as depicted in FIG. 1b has several disadvantages. For example, trench etching may penetrate the lower stop layer, 105 (if present), and damage the underlying substrate, 103. In addition, trench etching above an unfilled via often leads to loss of material from the upper rim of the via at the bottom of the trench and "faceting" as depicted in FIG. 1c. The loss of material from the via and the creation of facets, 109, hinder the precise and reproducible fabrication of visa. While faceting is perhaps a tolerable effect in some ICs, it becomes unacceptable as critical dimensions decrease and the need for precision and reproducibility in the CDs increases.

Figure 2:
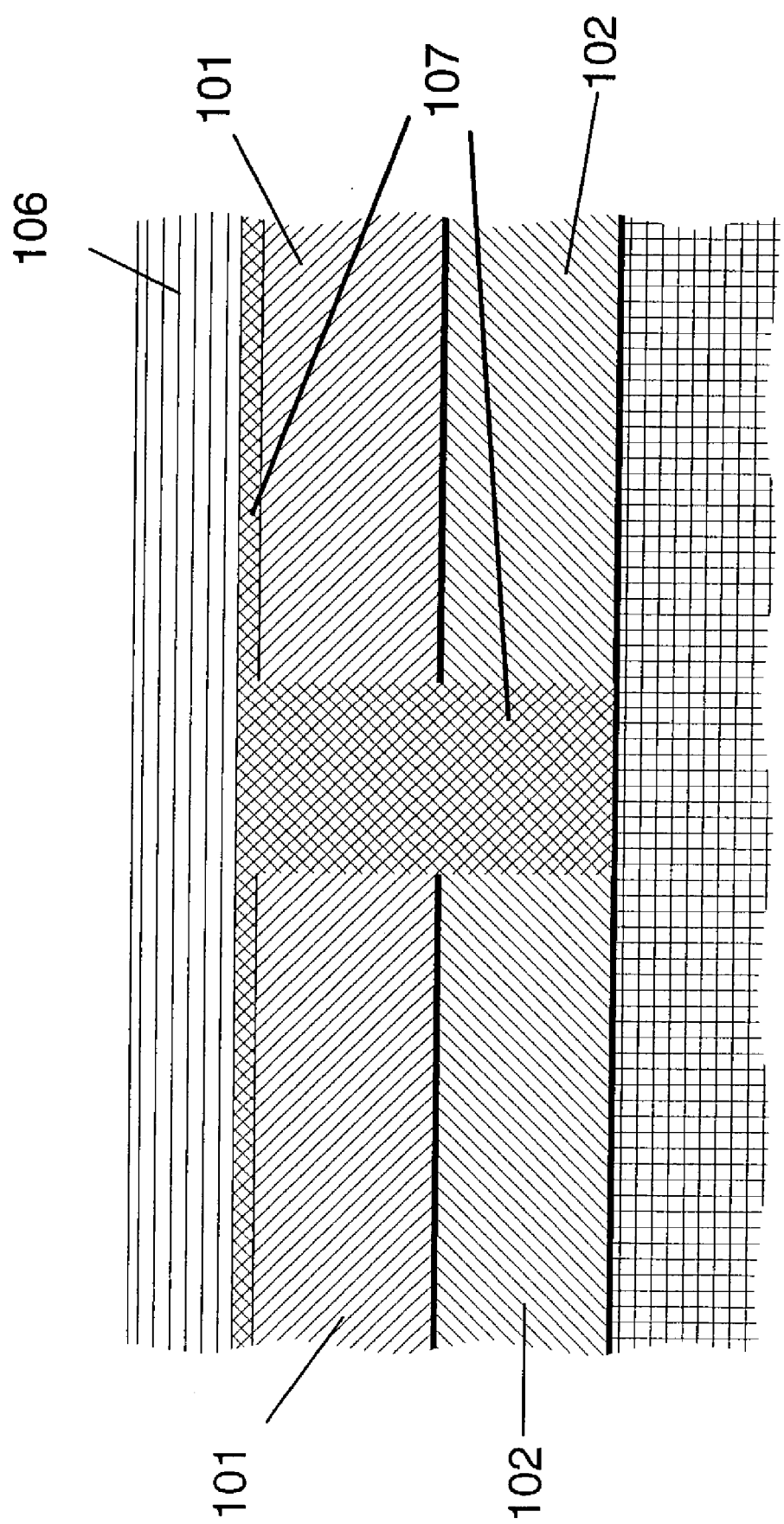
FIG. 2 depicts in schematic cross-sectional view the use of a BARC layer subsequent to via fabrication and underlying the photoresist.

One common approach to the reduction of faceting is the use of a bottom-antireflective-coating or BARC. As noted above, BARCBS are typically employed to improve the optical performance of photolithography in addition to reducing faceting. FIG. 2 depicts a BARC layer, 107, beneath photoresist, 106. As depicted, the BARC coating typically fills the via and coats the field regions on top of insulator layer 101. A coating of photoresist, 106, is then applied, to be patterned for the fabrication of the trench.

Figure 3:
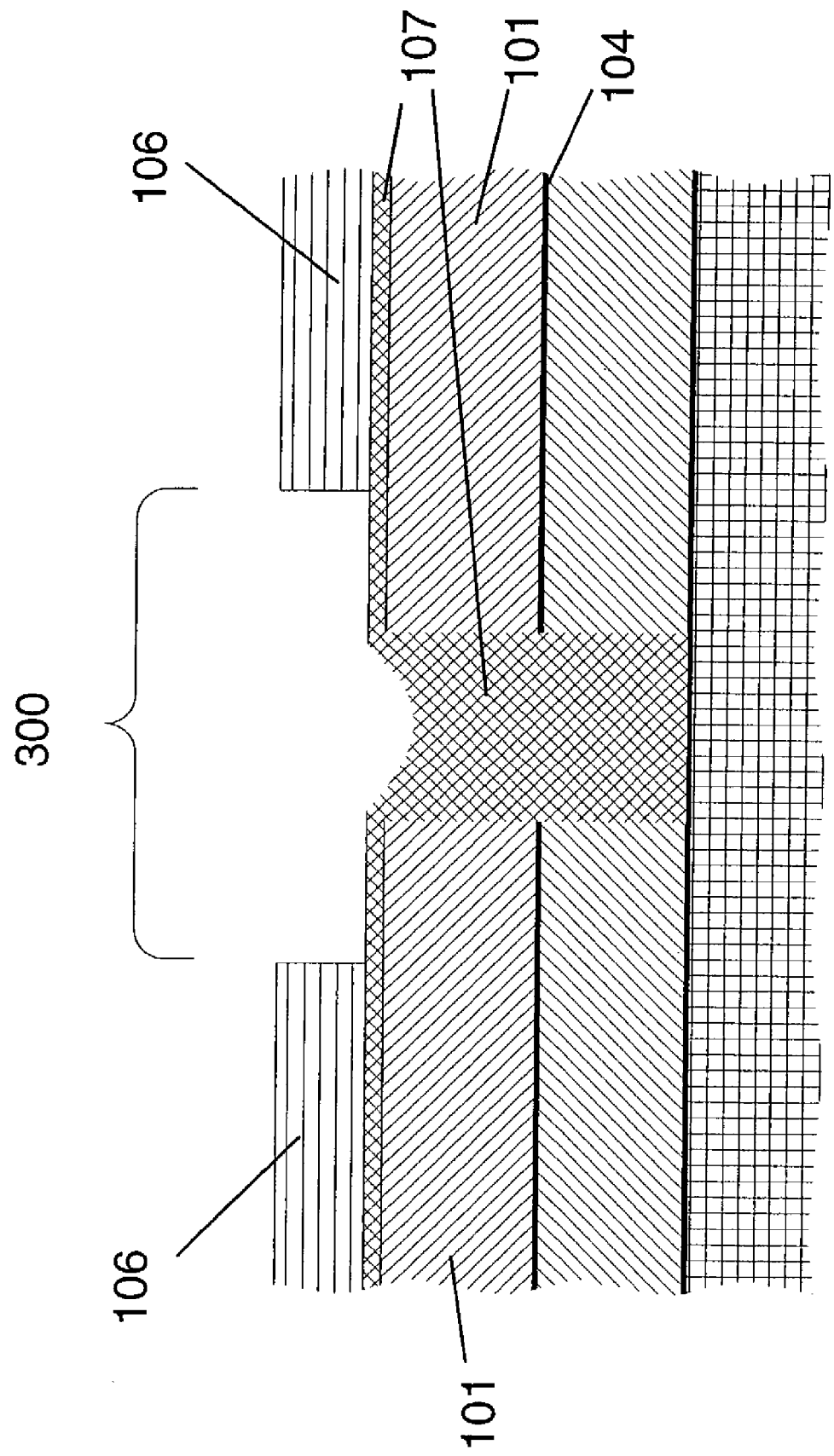
FIG. 3 depicts in schematic cross-sectional view patterning of the photoresist layer prior to trench etching, with the use of BARC.

The pattern of the trench to be etched in layer 101 is transferred to photoresist, 106, and the photoresist developed to generate the trench pattern, depicted as 300 in FIG. 3. Conventional techniques for photoresist patterning may cause BARC layer, 107, to partially etch into a concave shape or "dish" as depicted in FIG. 3.

Figure 4:
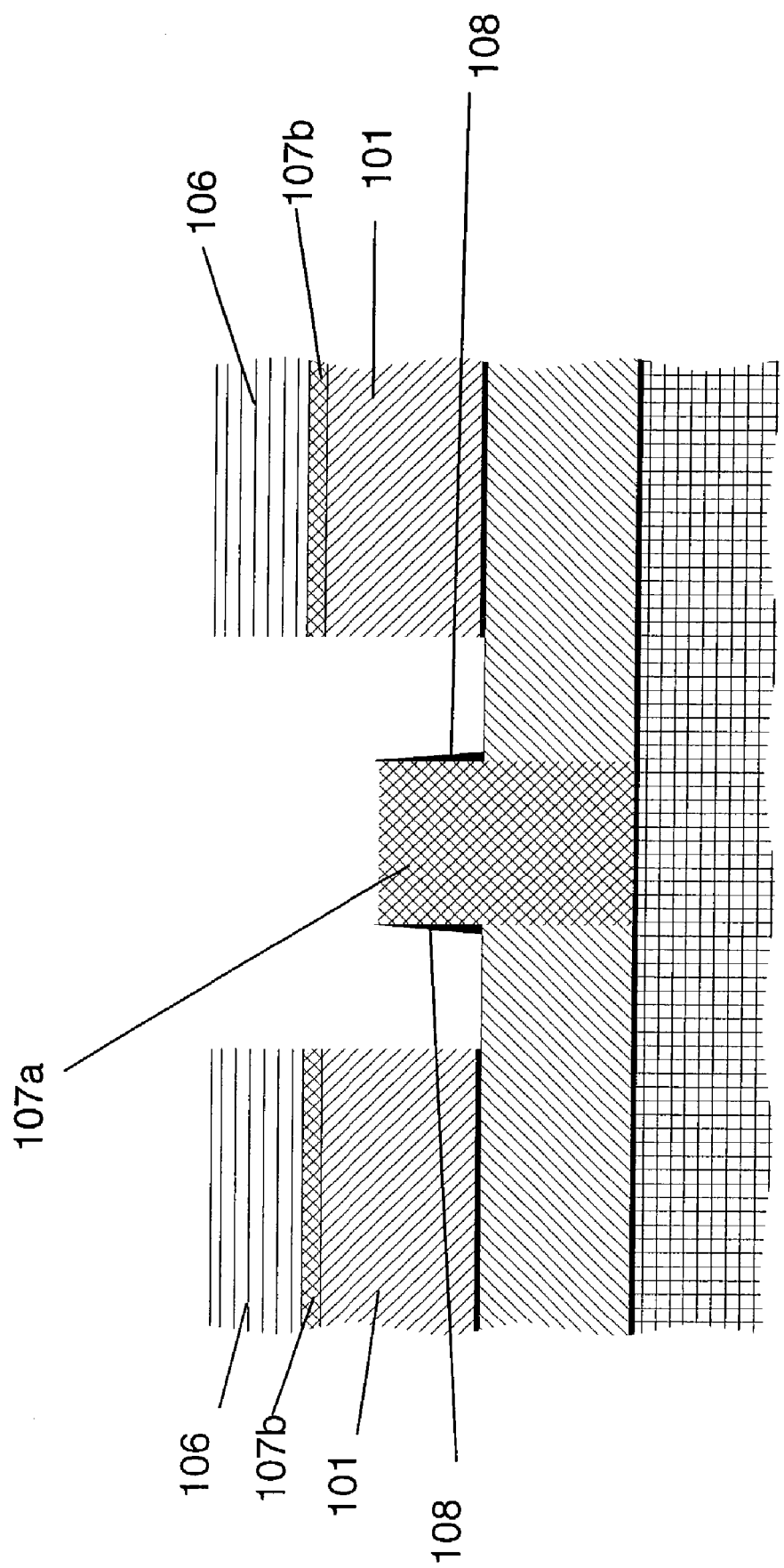
FIG. 4 depicts in schematic cross-sectional view conventional trench etching with BARC, resulting in fencing.

Via-first dual damascene now calls for the etching of a trench in layer 101. Typical insulator etching makes use of fluorocarbon plasma chemistry. However, such etching chemistries typically etch insulator faster than BARC and fencing is the common problem. FIG. 4 depicts the typical result of fluorocarbon chemistry plasma etching applied to the structure of FIG. 3 in which an island of BARC, 107a, remains surrounded by "fencing" 108. Field-region BARC, 107b, remains largely unaffected.

The composition of fencing material, 108, can be complex and include polymeric material formed and deposited from the chemical species present in the etching plasma, possibly including species formed from the insulator and/or BARC etching process. However, one major disadvantage of the presence of fencing, 108, is the difficulty of achieving good coating and coverage with subsequent barrier/adhesion layers. Typical Ta/TaN barrier/adhesion layers are deposited by physical vapor deposition (PVD). PVD achieves good step coating and uniform, conform al, coverage of sharp fences, 108, only with difficulty, and is not readily achieved in a production environment. Fences commonly produce shadowed regions not easily coated during PVD. Therefore, conventional IC fabrication techniques have typically included a separate processing step to remove fencing.

The present invention relates to the formation of definite structure in BARC, 107, that reduces or avoids fencing. Pursuant to some embodiments of the present invention, the partially-formed dual damascene structure depicted in FIG. 3 is treated with an etchant that removes BARC while leaving the insulator layers substantially unaffected. A BARC plug, 107c, partially filling the via is thereby formed. More particularly, the present invention involves the creation of a convex upper surface, 400, on the BARC material present in the via, 107c. The present invention demonstrates that etching a trench on the via containing therein the convex BARC structure of FIG. 5 typically does not result in fencing. That is, a trench etch performed on the structure of FIG. 5 results in a clean dual damascene structure as depicted in FIG. 6 lacking both facets, 109, and fencing, 108. Conform al coating with barrier/adhesion layer or other material is facilitated.

The convex BARC surface, 400, need not have a particular shape or structure so long as the regions near the via walls are depressed or lower than the average central BARC regions. That is, "convex" is used herein to indicate that the BARC thickness from its upper surface to substrate 103 measured immediately adjacent to the walls of the via is less than the typical BARC thickness near the center of the via, not to imply spherical or any other particular geometric shape.

Figure 5:
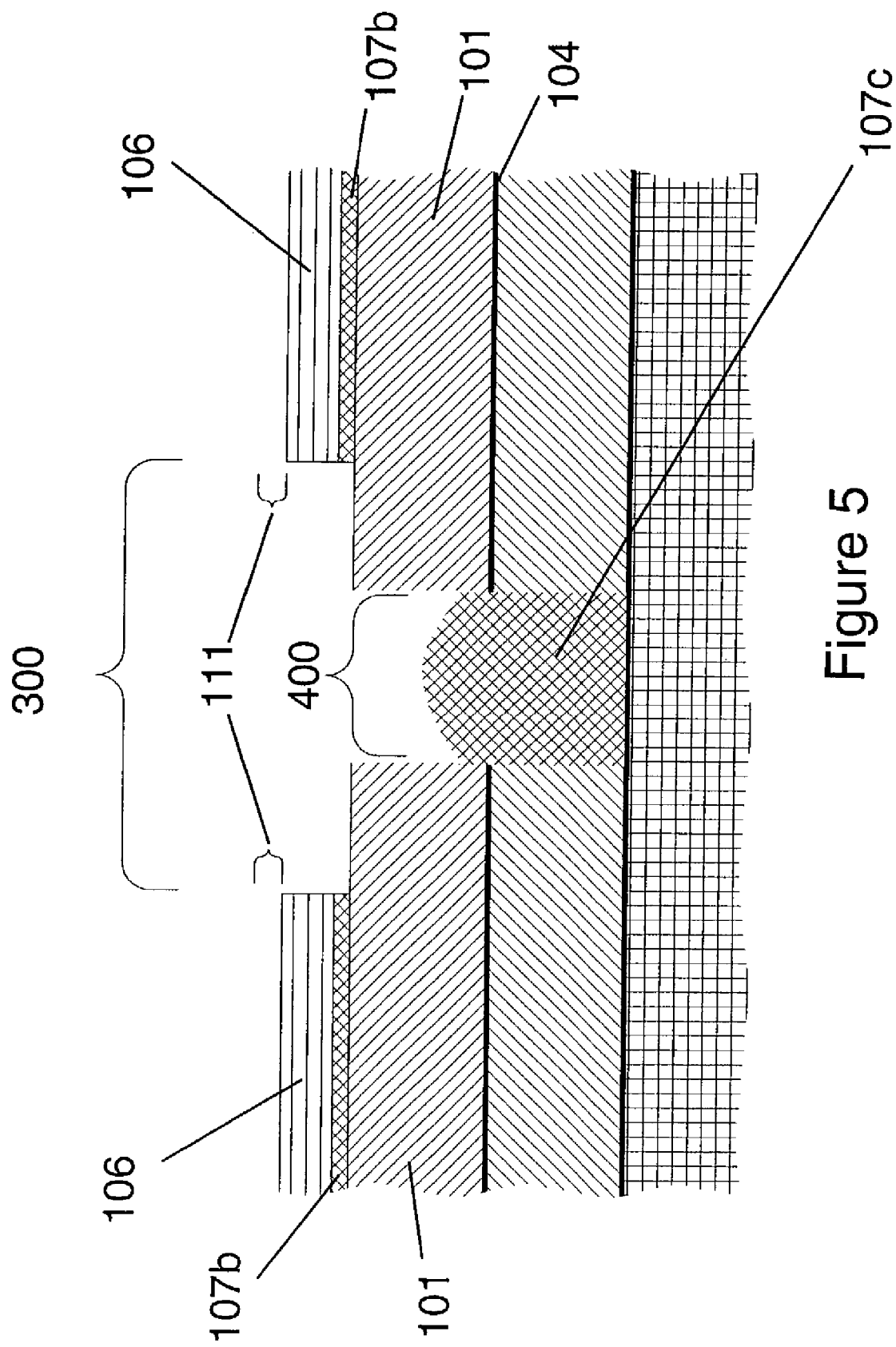
FIG. 5 depicts in schematic cross-sectional view a shaped BARC material partially filling the via and having a convex upper surface.
Figure 6:
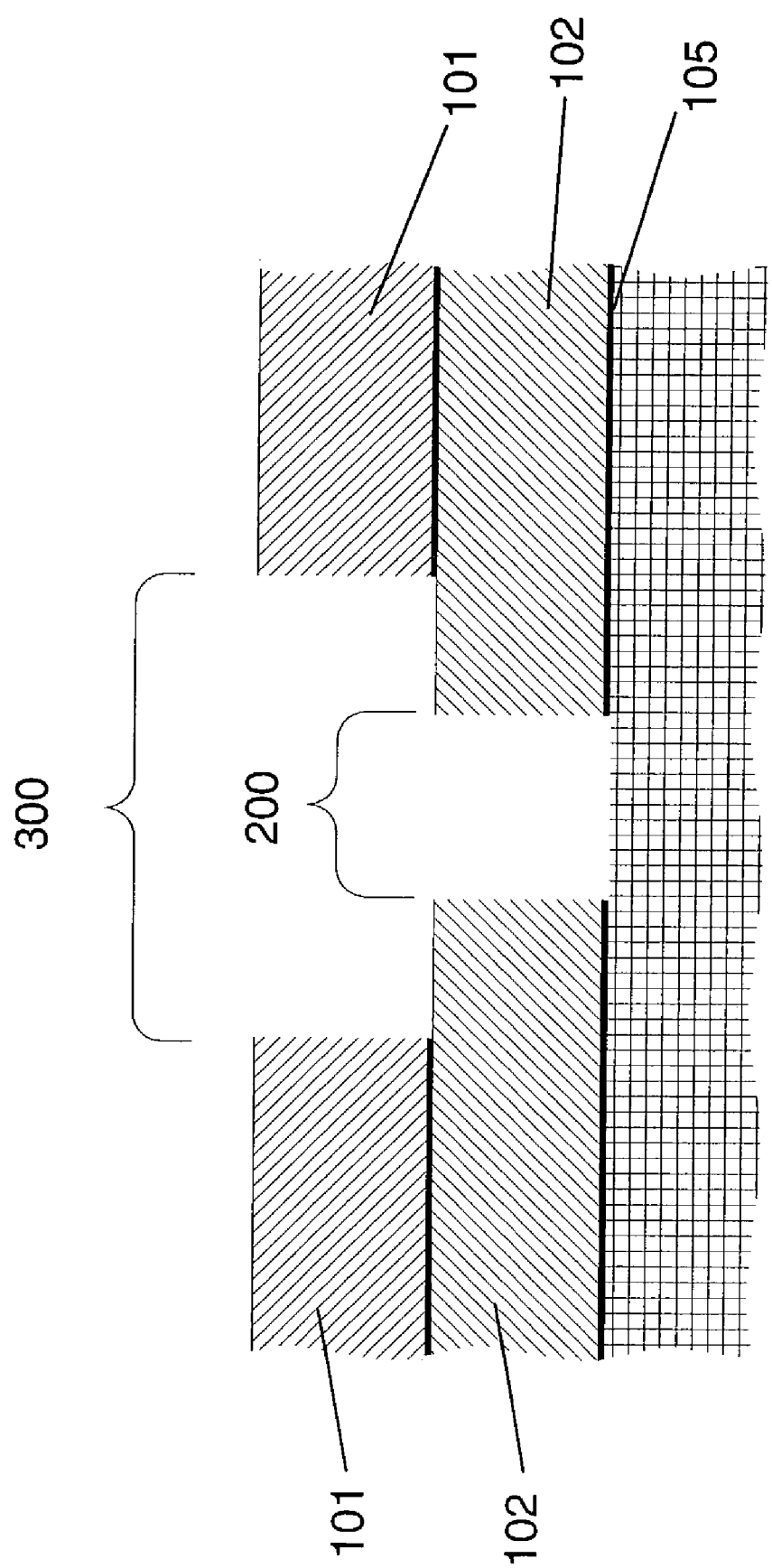
FIG. 6 depicts in schematic cross-sectional view the dual damascene feature obtained by conventional etching of a trench in the structure of FIG. 5.

The convex BARC structure depicted in FIG. 5 is conveniently obtained from the structure of FIG. 3 by treating with a directional etchant, for example, a positively charged ammonia plasma. Such directional etchants typically have increased sputtering yields near the edges of openings which, in the case of insulator etching, can produce undesirable results such as faceting depicted in FIG. 1c. The directional etchant employed in connection with the present invention advantageously etches typical BARC materials while leaving typical insulators substantially unaffected. Thus, treating the structure of FIG. 3 with such directional etchants can produce the BARC structure of FIG. 5 having a convex upper surface. When the trench is subsequently etched, the convex BARC leads to the desirable result of reducing fencing and producing a clean dual damascene structure amenable to conform al coating, as depicted in FIG. 6.

Typical BARC materials have etching properties not too dissimilar from typical photoresists. In practice, etching BARC will commonly also result in the loss of photoresist, depicted as 111 in FIG. 5. However, so long as sufficient photoresist remains to properly shield insulator 101 from undesired etching, no substantial harm results.

The present invention demonstrates that the use of substantially pure $NH_3$ plasma results in convex BARC as depicted in FIG. 5. Typically, the $NH_3$ plasma has a flow rate in the range from approximately 20 SCCM (standard cubic feet per minute) to approximately 500 SCCM, advantageously approximately 175 SCCM. The $NH_3$ plasma has a pressure in the range from approximately 20 milliTorr (mT) to approximately 300 mT, advantageously approximately 100 mT. The $NH_3$ plasma has electrical power in the range from approximately 200 watts (W) to approximately 1000 W, advantageously approximately 600 W. Etching the convex BARC structure resulting from the application of the $NH_3$ plasma with conventional insulator etching chemistries results in the clean dual damascene structure of FIG. 6.

Although various embodiments which incorporate the teachings of the present invention have been shown and described in detail herein, those skilled in the art can readily devise many other varied embodiments that still incorporate these teachings.

The invention claimed is:

1. A method of forming a dual damascene structure during the fabrication of an integrated circuit comprising:
    a) forming a via through at least one insulator layer;
    b) depositing a bottom-antireflective-coating material into said via and onto the field regions adjacent said via;
    c) depositing a photoresist on said bottom-antireflective-coating material;
    d) patterning said photoresist above said via in the form of a trench, exposing thereby one or more regions of said bottom-antireflective-coating material;
    e) directionally etching said bottom-antireflective-coating material to a level partially filling said via and such that the upper surface of said bottom-antireflective-coating material is convex; and
    f) etching a trench through said at least one insulator layer to a depth less than the depth of said via.

2. A method as in claim 1 wherein said at least one insulator layer comprises at least one oxide layer.

3. A method as in claim 1 wherein said directional etch is by ammonia plasma.

4. A method as in claim 3 wherein said ammonia plasma has a flow rate in the range from approximately 20 standard cubic feet per minute to approximately 500 standard cubic feet per minute.

5. A method as in claim 4 wherein said ammonia plasma has a flow rate of approximately 175 standard cubic feet per minute.

6. A method as in claim 3 wherein said ammonia plasma has a pressure in the range from approximately 20 milliTorr to approximately 300 milliTorr.

7. A method as in claim 6 wherein said ammonia plasma has a pressure of approximately 100 milliTorr.

8. A method as in claim 3 wherein said ammonia plasma has electrical power in the range from approximately 200 watts to approximately 1000 watts.

9. A method as in claim 8 wherein said ammonia plasma has electrical power of approximately 600 watts.

10. A method as in claim 1 further comprising:
   g) stripping said photoresist and said bottom-antireflective-coating material; and
   h) depositing a coating layer substantially conformally on the interior surfaces of said trench and said via.

11. A method as in claim 10 wherein said coating layer is a barrier/adhesion layer.

12. A method as in claim 11 further comprising:
   i) depositing an electrical conductor on said coating layer.

13. A method as in claim 12 wherein said electrical conductor is copper.

14. A method of reducing fencing in the formation of a dual damascene integrated circuit structure comprising:
   a) forming a via through at least one insulator layer;
   b) depositing a bottom-antireflective-coating material into said via and onto the field regions adjacent said via;
   c) depositing a photoresist on said bottom-antireflective-coating material;
   d) patterning said photoresist above said via in the form of a trench, exposing thereby one or more regions of said bottom-antireflective-coating material;
   e) directionally etching said bottom-antireflective-coating material to a level partially filling said via and such that the upper surface of said bottom-antireflective-coating material is convex; and
   f) etching a trench through said at least one insulator layer to a depth less than the depth of said via.

15. A method as in claim 14 wherein said at least one insulator layer comprises at least one oxide layer.

16. A method as in claim 14 wherein said directional etch is by ammonia plasma.

17. A method as in claim 16 wherein said ammonia plasma has a flow rate in the range from approximately 20 standard cubic feet per minute to approximately 500 standard cubic feet per minute.

18. A method as in claim 17 wherein said ammonia plasma has a flow rate of approximately 175 standard cubic feet per minute.

19. A method as in claim 16 wherein said ammonia plasma has a pressure in the range from approximately 20 milliTorr to approximately 300 milliTorr.

20. A method as in claim 19 wherein said ammonia plasma has a pressure of approximately 100 milliTorr.

21. A method as in claim 16 wherein said ammonia plasma has electrical power in the range from approximately 200 watts to approximately 1000 watts.

22. A method as in claim 21 wherein said ammonia plasma has electrical power of approximately 600 watts.

23. A method as in claim 14 further comprising:
   g) stripping said photoresist and said bottom-antireflective-coating material; and
   h) depositing a coating layer substantially conformally on the interior surfaces of said trench and said via.

24. A method as in claim 23 wherein said coating layer is a barrier/adhesion layer.

25. A method as in claim 24 further comprising:
   i) depositing an electrical conductor on said coating layer.

26. A method as in claim 25 wherein said electrical conductor is copper.

* * * * *